(12) United States Patent
Kim et al.

(10) Patent No.: US 11,721,613 B2
(45) Date of Patent: Aug. 8, 2023

(54) POWER MODULE

(71) Applicants: HYUNDAI MOTOR COMPANY, Seoul (KR); KIA CORPORATION, Seoul (KR)

(72) Inventors: Tae Hwa Kim, Hwaseong-si (KR); Myung Ill You, Gwangju (KR); Jin Myeong Yang, Seongnam-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 19 days.

(21) Appl. No.: 17/373,126

(22) Filed: Jul. 12, 2021

(65) Prior Publication Data
US 2022/0068769 A1 Mar. 3, 2022

(30) Foreign Application Priority Data
Aug. 26, 2020 (KR) .......... 10-2020-0107931

(51) Int. Cl.
*H01L 23/495* (2006.01)
*H01L 23/498* (2006.01)
*H01L 23/047* (2006.01)
*H01L 23/00* (2006.01)

(52) U.S. Cl.
CPC .......... *H01L 23/495* (2013.01); *H01L 23/047* (2013.01); *H01L 23/498* (2013.01); *H01L 24/32* (2013.01); *H01L 24/73* (2013.01); *H01L 2224/2612* (2013.01); *H01L 2224/32225* (2013.01); *H01L 2224/32245* (2013.01); *H01L 2224/73251* (2013.01); *H01L 2924/30107* (2013.01)

(58) Field of Classification Search
CPC ... H01L 23/495; H01L 23/047; H01L 23/498; H01L 24/32; H01L 24/73; H01L 2224/2612; H01L 2224/32225; H01L 2224/32245; H01L 2224/73251; H01L 2924/30107
See application file for complete search history.

(56) References Cited

U.S. PATENT DOCUMENTS 9,922,911 B1 * 3/2018 Park .................. H01L 23/49562

FOREIGN PATENT DOCUMENTS

| KR | 2017-0069363 A | 6/2017 |
| KR | 2017-0092750 A | 8/2017 |
| KR | 2018-0052143 A | 5/2018 |

* cited by examiner

*Primary Examiner* — Jasmine J Clark
(74) *Attorney, Agent, or Firm* — McDonnell Boehnen Hulbert & Berghoff LLP

(57) ABSTRACT

A power module includes a power semiconductor device, a first power lead electrically connected to a first power terminal of the power semiconductor device, a second power lead disposed in parallel to the first power lead near the first power lead and electrically connected to a second power terminal of the power semiconductor device, and a conductive plate disposed to be spaced apart from the first power lead or the second power lead by a predetermined distance such that a region overlapping with the first power lead or the second power lead is formed.

11 Claims, 7 Drawing Sheets

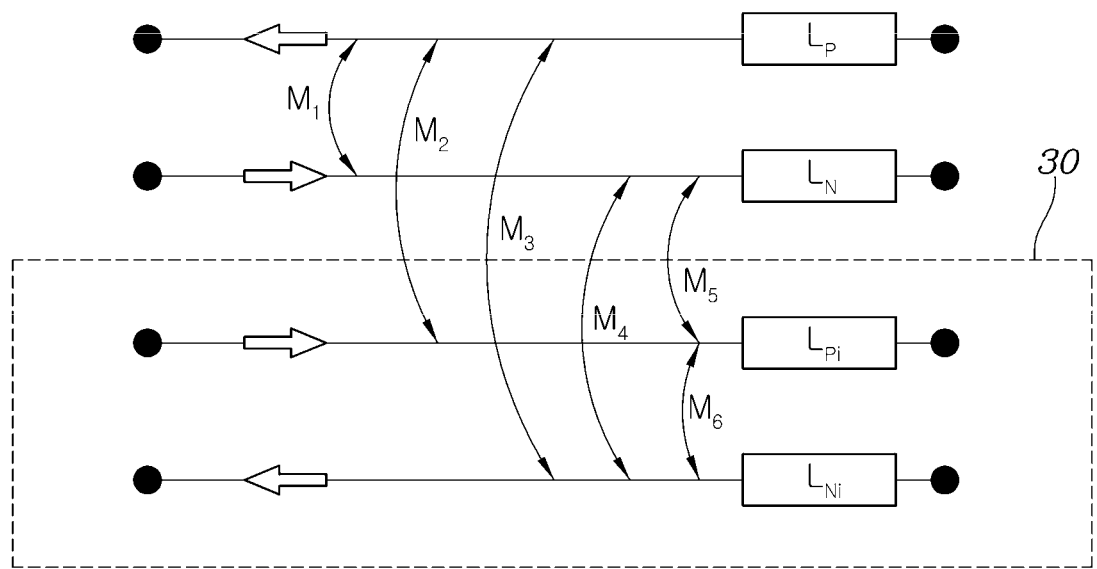
Loop Inductance
$$L_{TOTAL\_i} = L_P + L_N - M_1 - M_2 + M_3 - M_4 + M_5 - M_6$$
FIG. 5
FIG. 6
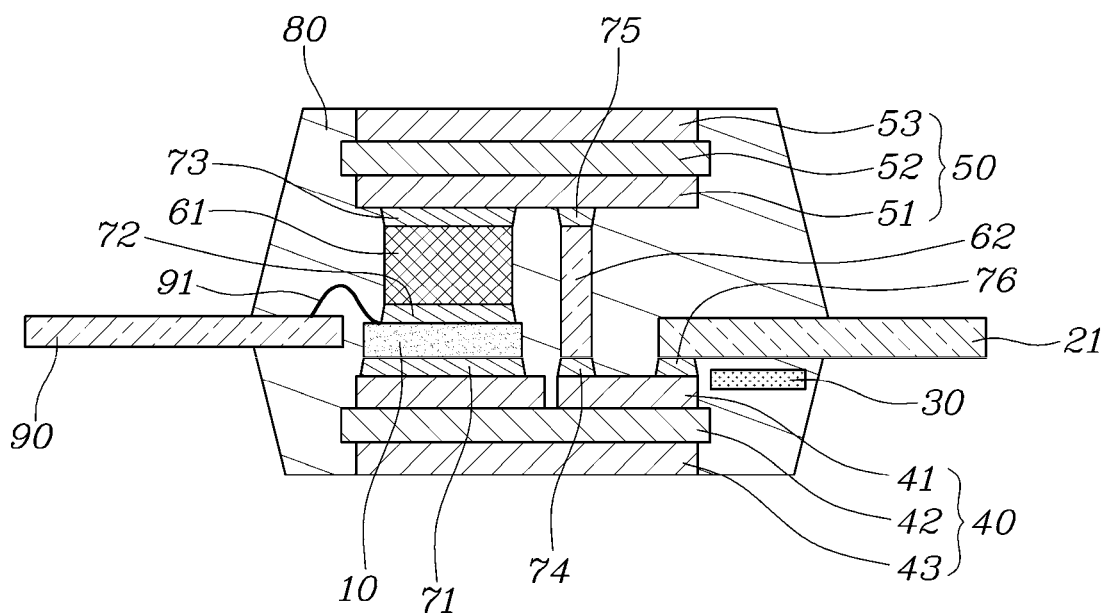

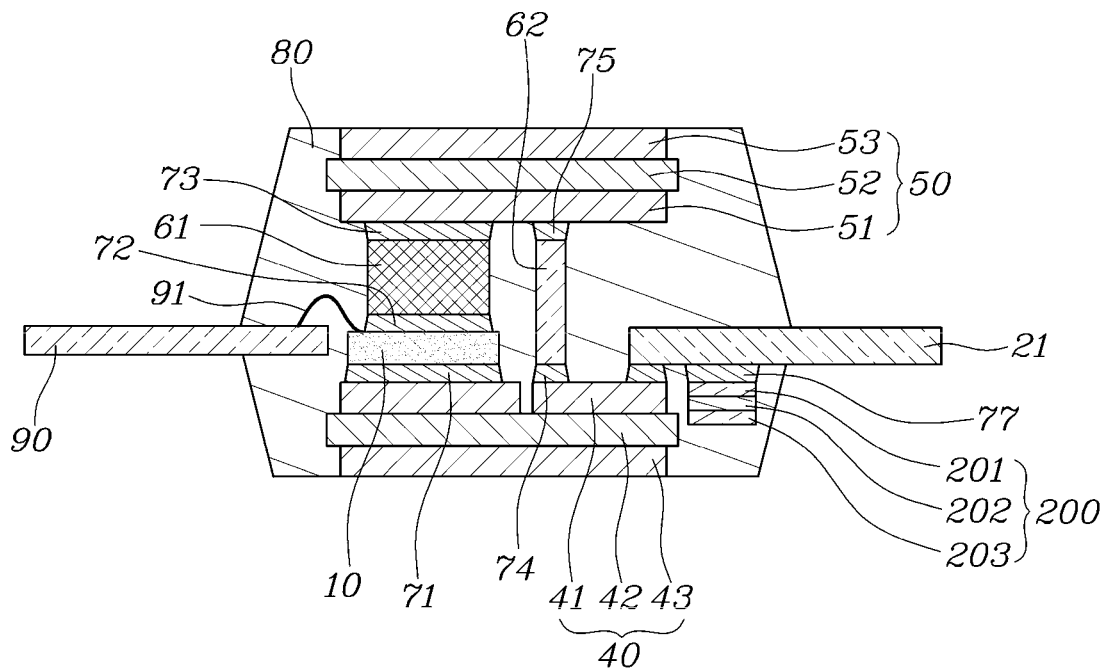
FIG. 9
FIG. 10
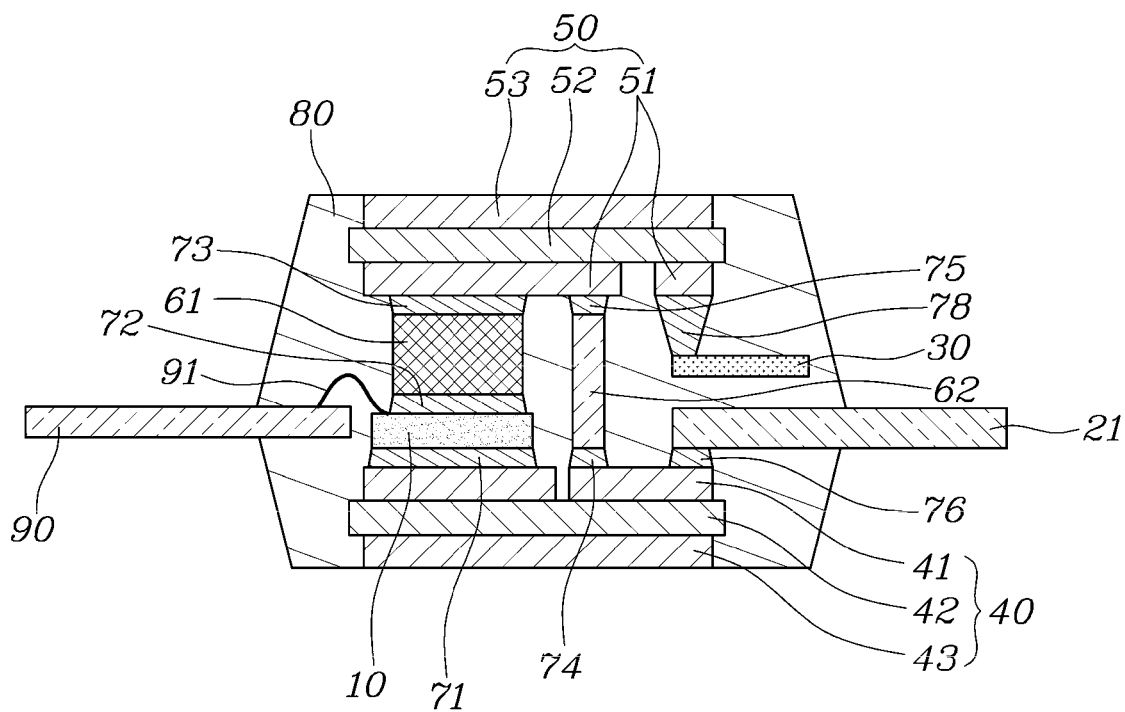

POWER MODULE

CROSS REFERENCE TO RELATED APPLICATIONS

This application claims priority from Korean Patent Application No. 10-2020-0107931, filed on Aug. 26, 2020 in the Korean Intellectual Property Office, the disclosure of which is incorporated herein by reference in its entirety.

BACKGROUND

1. Field

The present disclosure relates to a power module, and more particularly to a power module capable of reducing internal parasitic inductance.

2. Description of the Related Art

A power module is a device used to convert direct current (DC) power into alternating current (AC) power upon driving a motor in a hybrid vehicle, an electric vehicle, etc.

Generally, such a power module may include a substrate, a power semiconductor device, which is a switching element bonded to the substrate, a power lead to apply electric power to the power semiconductor device, and a signal lead to provide a control signal to the power semiconductor device.

The power module, which is a switching element, repeats continuous on/off operations. However, there may be a problem in that an overshoot voltage may be generated during on/off operations due to internal parasitic inductance caused by the power lead in the power module.

The overshoot voltage may increase power loss and noise in the entirety of a system to which the power module is applied. In a severe case, damage to the power semiconductor device may occur.

In the power module, internal parasitic inductance increases as the path of current in the power module is lengthened. In order to reduce the parasitic inductance, therefore, it is important to reduce the length of the current path in the power module. In particular, the length of the power lead connected to the power semiconductor device in the power module greatly influences the current path.

However, reducing the length of the power lead disposed within the power module is limited due to structural characteristics of the power module. Therefore, a new power module structure capable of reducing internal parasitic inductance of the power module even when the length of the power lead is fixed is required.

The above matters disclosed in this section are merely for enhancement of understanding of the general background of the disclosure and should not be taken as an acknowledgement or any form of suggestion that the matters form the related art already known to a person skilled in the art.

SUMMARY

Therefore, the present disclosure has been made in view of the above problems, and it is an object of the present disclosure to provide a power module having a structure capable of reducing system power loss and noise and preventing damage to a power semiconductor device by reducing parasitic inductance in the power module, thereby reducing an overshoot voltage generated upon on/off operations of the power semiconductor device.

In accordance with an aspect of the present disclosure, the above and other objects can be accomplished by the provision of a power module including a power semiconductor device, a first power lead electrically connected to a first power terminal of the power semiconductor device, a second power lead disposed in parallel to the first power lead near the first power lead and electrically connected to a second power terminal of the power semiconductor device, and a conductive plate disposed to be spaced apart from the first power lead or the second power lead by a predetermined distance such that a region overlapping with the first power lead or the second power lead is formed.

The conductive plate may be disposed such that regions respectively overlapping with the first power lead and the second power lead are formed.

The conductive plate may be disposed at an upper or lower side of the first power lead or the second power lead such that the overlapping region is formed in a vertical direction.

The power module may further include a first metal layer bonded, at one surface thereof, to an upper or lower side of the first power lead or the second power lead, an insulating layer bonded, at one surface thereof, to the other surface of the first metal layer, and a second metal layer bonded to the other surface of the insulating layer. The conductive plate may be embodied by the second metal layer.

The first metal layer may be formed with a pattern such that a region bonded to the first power lead and a region bonded to the second power lead are electrically insulated from each other.

The power module may further include a lower substrate disposed at a lower side of the power semiconductor device and formed with an electrical connection to the first power terminal of the power semiconductor device, and an upper substrate disposed at an upper side of the power semiconductor device and formed with an electrical connection to the second power terminal of the power semiconductor device. The conductive plate may be bonded to a lower surface of the upper substrate.

The upper substrate may include a first metal layer having a region electrically connected to the second power terminal and a region to which the conductive plate is bonded. The first metal layer may be formed with a pattern such that the region electrically connected to the second power terminal and the region, to which the conductive plate is bonded, are electrically insulated from each other.

The power module may further include a first metal layer disposed at an upper side of the power semiconductor device and electrically connected to one of the power terminals of the power semiconductor device, an insulating layer bonded, at a lower surface thereof, to an upper surface of the first metal layer, and a second metal layer bonded to an upper surface of the insulating layer. The conductive plate may be embodied by the first metal layer extending to upper and lower sides of the first and second power leads.

The power module may further include a mold configured to mold the power semiconductor device, a portion of the first power lead, a portion of the second power lead, and the conductive plate. The conductive plate may be disposed at a lower side of the first power lead or the second power lead such that an upper surface of the conductive plate is spaced apart from the first power lead or the second power lead by a predetermined distance while facing the first power lead or the second power lead, and a lower surface of the conductive plate is exposed to an outside of the mold.

The power module may further include a mold configured to mold the power semiconductor device, the first power lead and the second power lead while partially exposing lower surfaces of the first power lead and the second power lead. The conductive plate may be disposed at an upper side of the first power lead or the second power lead.

The mold may prevent the first power lead and the second power lead from being exposed in a horizontal direction.

In accordance with the power module, a conductive plate, which functions as an image plate, is installed adjacent to a power lead, through which current entering and exiting a power semiconductor module flows, such that image current may flow through the conductive plate. Accordingly, it may be possible to reduce inductance of a loop, through which current flows, in accordance with mutual inductance increasing due to the image current.

As a result, it may be possible to reduce an overshoot voltage generated upon a switching operation due to parasitic inductance in the power module. Accordingly, system power loss and noise caused due to the overshoot voltage may be reduced, and damage to a power semiconductor device may also be prevented.

The effects attainable in the present disclosure are not limited to the above-described effects and other effects which are not described herein may be derived by those skilled in the art from the following description of the embodiments of the disclosure.

BRIEF DESCRIPTION OF THE FIGURES

The above and other objects, features and other advantages of the present disclosure will be more clearly understood from the following detailed description taken in conjunction with the accompanying drawings, in which:

FIG. 5 is a view showing inductances formed in accordance with current flow through the power leads in the power module according to the exemplary embodiment of the present disclosure; and FIGS. 6, 7, 8, 9, 10, 11, 12, 13, and 14 are sectional views illustrating power modules according to various exemplary embodiments of the present disclosure, respectively.

DETAILED DESCRIPTION

Reference will now be made in detail to the preferred embodiments of the present disclosure, examples of which are illustrated in the accompanying drawings. Wherever possible, the same reference numbers will be used throughout the drawings to refer to the same or like parts.

Hereinafter, a power module according to various exemplary embodiments of the present disclosure will be described with reference to the accompanying drawings.

Figure 1:
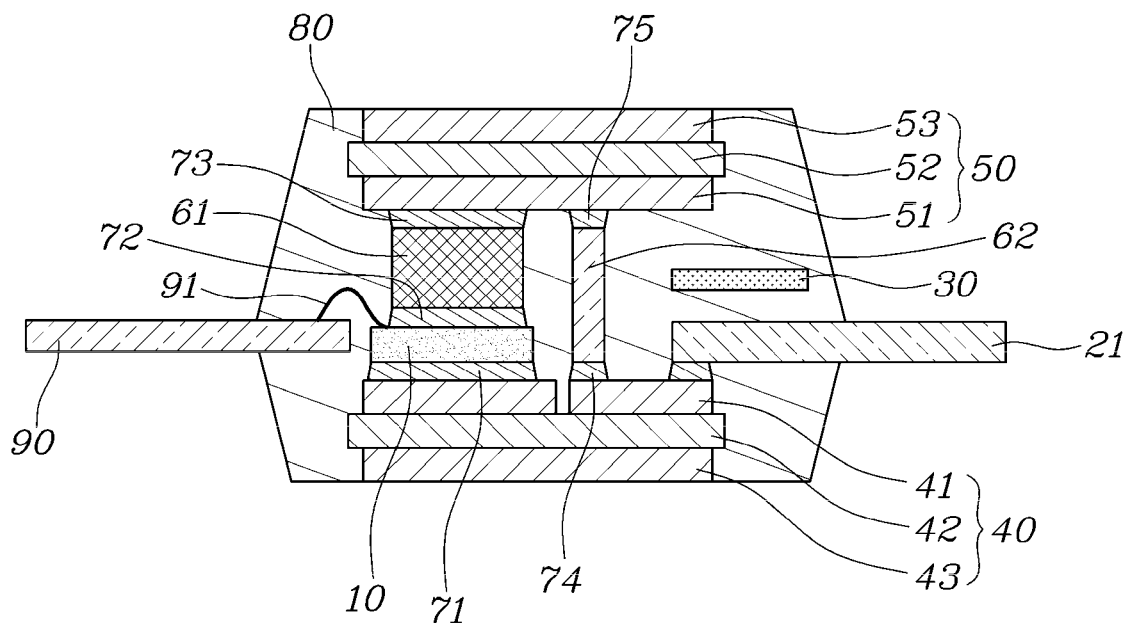
FIG. 1 is a sectional view of a power module according to an exemplary embodiment of the present disclosure.
Figure 2:
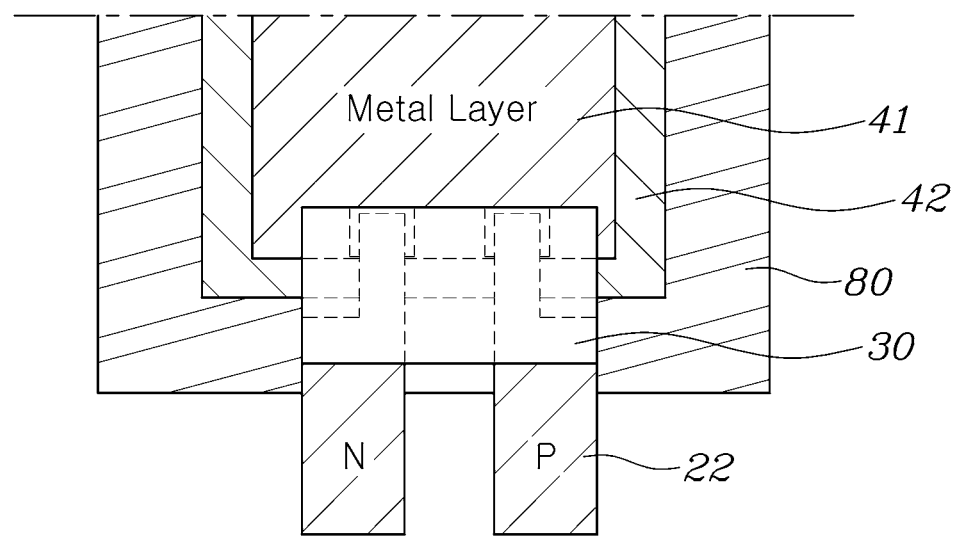
FIG. 2 is a plan view of the power module shown in FIG. 1 in a state in which a part of the configuration of the power module is omitted, when viewed from the top.

FIG. 1 is a sectional view of a power module according to an exemplary embodiment of the present disclosure. FIG. 2 is a plan view of the power module shown in FIG. 1 in a state in which a part of the configuration of the power module is omitted, when viewed from the top. In particular, FIG. 2 is a plan view of a lower substrate 40, power leads 21 and 22, and a conductive plate 30 when viewed from the top.

The power module according to the exemplary embodiment of the present disclosure may include a power semiconductor device 10, a first power lead 21 electrically connected to a first power terminal of the power semiconductor device 10, and a second power lead 22 disposed in parallel to the first power lead 21 near the first power lead 21, close enough to generate mutual inductance as known in the art, and electrically connected to a second power terminal of the power semiconductor device 10. The power module may further include a conductive plate 30 spaced apart from the first power lead 21 and the second power lead 22 such that regions, in which the conductive plate 30 overlaps with the first power lead 21 and the second power lead 22, are formed.

In addition, the power module according to the exemplary embodiment of the present disclosure may further include a lower substrate 40, to which one surface of the power semiconductor device 10 is bonded, a spacer 61 bonded, at one surface thereof, to the other surface of the power semiconductor device 10, and an upper substrate 50 to which the other surface of the spacer 61 is bonded. The power module may further include a via-spacer 62 bonded, at opposite ends thereof, to the upper substrate 50 and the lower substrate 40, respectively, and a mold 80 made of an insulating material to mold the elements constituting the power module.

Various exemplary embodiments of the present disclosure are characterized in that the conductive plate 30 is disposed such that regions, in which the conductive plate 30 overlaps with the power leads 21 and 22 functioning as paths for current entering or exiting the power semiconductor device 10, are formed.

Figure 3:
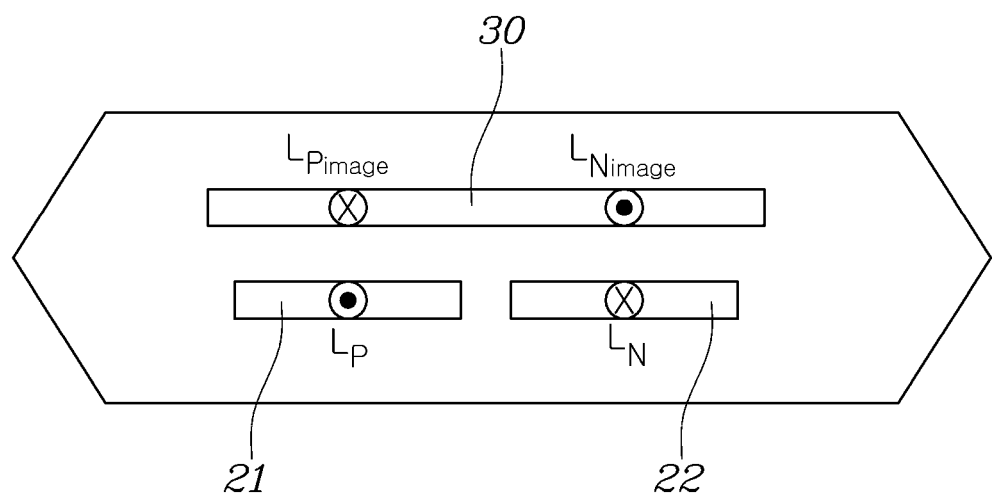
FIG. 3 is a view showing current flow relation between each power lead and a conductive plate in the power module according to the exemplary embodiment of the present disclosure.
Figure 4:
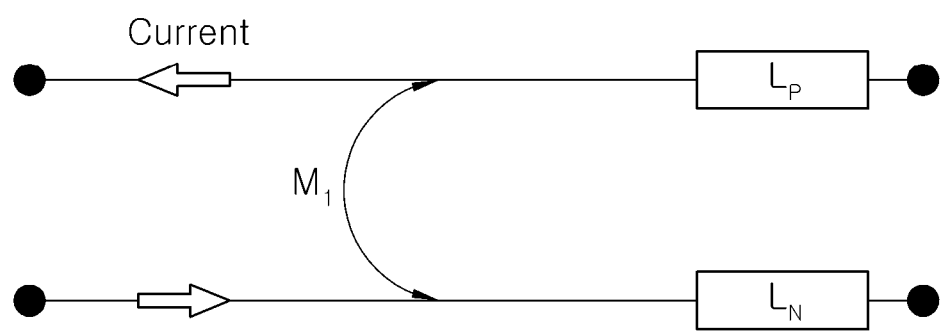
FIG. 4 is a view showing inductances formed in accordance with current flow through power leads in a power module in which there is no conductive plate.

FIG. 3 is a view showing current flow relation between each power lead and the conductive plate in the power module according to the exemplary embodiment of the present disclosure. FIG. 4 is a view showing inductances formed in accordance with current flow through power leads in a power module in which there is no conductive plate. FIG. 5 is a view showing inductances formed in accordance with current flow through the power leads in the power module according to the exemplary embodiment of the present disclosure.

As shown in FIG. 3, when the conductive plate 30 is disposed adjacent to the power leads 21 and 22, high-frequency current in an opposite direction to current flowing through the power leads 21 and 22 is generated at portions of the conductive plate 30 adjacent to respective power leads 21 and 22 during a high-speed switching operation of the power semiconductor device in the power module. That is, the conductive plate 30 may function as an image plate at which image current is formed due to current flowing through each of the power leads 21 and 22.

As shown in FIG. 4, when the conductive plate 30 is not disposed, mutual inductance $M_1$ caused by current flowing through the two power leads 21 and 22 may act on inductances $L_P$ and $L_N$ of respective power leads 21 and 22. As a result, inductance $L_{TOTAL}$ formed at a current loop formed by the two power leads 21 and 22 may be equal to a value obtained by deducting double the mutual inductance $M_1$ from the sum of the inductances $L_P$ and $L_N$ of respective power leads.

On the other hand, as shown in FIG. 5, when image current flowing through the conductive plate 30 is generated in accordance with disposition of the conductive plate 30, a greater mutual inductance may act due to the image current. As a result, the inductance $L_{TOTAL}$ formed at the current loop formed by the two power leads 21 and 22 may be equal to a value obtained by deducting inductance greater than double the mutual inductance $M_1$ rom the sum of the inductances $L_P$ and $L_N$ of respective power leads. Thus, the inductance in this case is reduced, as compared to the power module in which the conductive plate 30 is not disposed.

In order to generate mutual inductance caused by image current flowing through the conductive plate 30 functioning as an image plate, the conductive plate 30 may be disposed to form a region overlapping with at least one of the first power lead and the second power lead in one direction (a vertical direction in FIG. 1). Most preferably, the conductive plate 30 may be disposed to form regions respectively overlapping with both the first power lead and the second power lead.

The exemplary embodiment illustrated in FIG. 1 is an embodiment in which respective substrates 40 are provided at upper and lower sides of the power semiconductor device 10. The power semiconductor device 10 may be provided, at upper and lower surfaces thereof, with power terminals (not shown) through which current for power conversion is input/output. The power terminal provided at the lower surface of the power semiconductor device 10 may be connected to the upper substrate 50.

For the lower substrate 40, a substrate constituted by an insulating layer 42 and metal layers 41 and 43 respectively bonded to upper and lower surfaces of the insulating layer 42 may be used. In the technical field to which the present disclosure pertains, such a substrate is referred to as a double-bonded copper (DBC) substrate. The first metal layer 41 of the lower substrate 40 may be formed with a pattern for achieving electrical connection. A lower surface of the power semiconductor device 10 may be bonded to the first metal layer 41 and, as such, the first metal layer 41 may form an electrical contact with one power terminal of the power semiconductor device 10.

Although not shown, a cooling channel for cooling of the power module may contact a lower surface of the second metal layer 43 of the lower substrate 40.

Similarly, for the upper surface 40, a substrate constituted by an insulating layer 52 and metal layers 51 and 53 respectively bonded to upper and lower surfaces of the insulating layer 52 may be used. The first metal layer 51 of the upper substrate 50 may be bonded to an upper surface of the power semiconductor device 10 via a spacer 61 and, as such, may form electrical connection with the other power terminal of the power semiconductor device 10.

Similarly to the second metal layer 43 of the lower substrate 40, a cooling channel for cooling of the power module may contact an upper surface of the second metal layer 53 of the upper substrate 50.

The first metal layer 51 of the upper substrate 50 may form electrical connection with the first metal layer 41 of the lower substrate 50 via a via-spacer 62. Of course, the pattern of the first metal layer 41 may be formed in a region of the first metal layer 41 electrically connected to the power terminal formed at the lower surface of the power semiconductor device 10 and a region of the first metal layer 41 electrically connected to the first metal layer 51 of the upper substrate 50 via the via-spacer 62, in order to form mutual electrical insulation.

The first power lead 21 and the second power lead 22 may be electrically joined to the region of the first metal layer 41 connected to the lower power terminal of the power semiconductor device 10 and the region of the first metal layer 41 connected to the upper power terminal of the power semiconductor device 10 via the via-spacer 62, respectively. The first power lead 21 and the second power lead 22 may have regions exposed to the outside of the mold 80 of the power module as paths through which the first power lead 21 and the second power lead 22 receive or transmit current from and to the outside of the power semiconductor device, respectively.

In the exemplary embodiment illustrated in FIG. 1, the conductive plate 30 may be disposed at upper sides of the power leads 21 and 22.

In addition, the power module may further include a signal lead 90 for receiving a control signal for control of the power semiconductor device 10, and a wire 91 for interconnecting the signal lead 90 and a control signal input terminal (not shown) provided at the power semiconductor device 10.

In FIG. 1, reference numerals "71 to 76" designate joints where electrical and physical bonding of elements is achieved, respectively. Such joints may be formed through soldering, sintering or the like which is a known element bonding process.

FIGS. 6 to 14 are sectional views illustrating power modules according to various exemplary embodiments of the present disclosure, respectively.

The exemplary embodiment illustrated in FIG. 6 is an embodiment in which a conductive plate 30 is formed at lower sides of power leads 21 and 22 such that the conductive plate 30 overlaps with the power leads 21 and 22 in a vertical direction of the power module.

Figure 7:
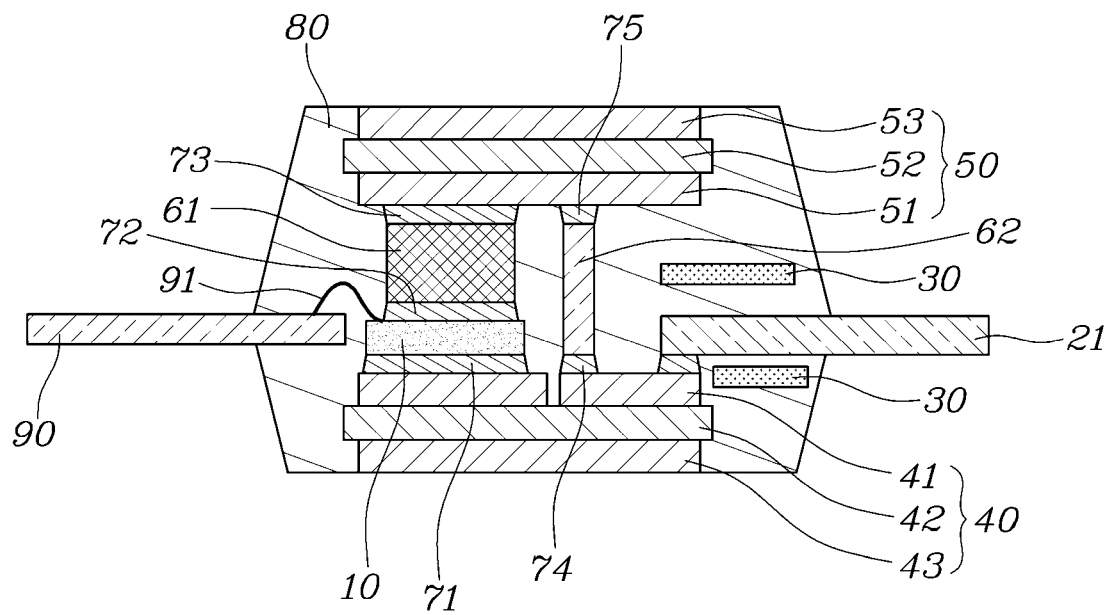

The exemplary embodiment illustrated in FIG. 7 is an embodiment in which conductive plates 30 are formed at upper and lower sides of power leads 21 and 22, respectively, such that the conductive plates 30 overlap with the power leads 21 and 22 in a vertical direction of the power module.

As in the exemplary embodiments of FIGS. 1, 6, and 7, the conductive plate 30 may be installed at upper sides, lower sides or both upper and lower sides of the power leads 21 and 22. Of course, when the conductive plate 30 is installed only at one of the upper and lower sides of the power leads 21 and 22, it is more preferred that the conductive plate 30 be installed at the upper sides of the power leads 21 and 22. Since the power leads 21 and 22 are mainly bonded to the lower substrate 40, there may be a spatial limitation at the lower sides of the power leads 21 and 22 due to the lower substrate 40. Accordingly, when the conductive plate 30 is installed at the upper sides of the power leads 21 and 22, it may be possible to increase the size of regions where the power leads 21 and 22 overlap with the conductive plate 30, respectively, and, as such, greater image current may be formed. In the exemplary embodiment illustrated in FIG. 8, a substrate 100 having a metal layer corresponding to a conductive plate is bonded to the power leads 21 and 22, in place of the case in which only the conductive plate 30 is separately disposed, and, as such, the process of installing the conductive plate becomes convenient.

The substrate 100 is a substrate having an insulating layer 102 and first and second metal layers 101 and 103 respectively bonded to opposite surfaces of the insulating layer 102, as in the lower substrate 40 or the upper substrate 50. Although the first metal layer 101 is bonded to the power leads 21 and 22, the first metal layer 101 may function as the conductive plate 30 because the second metal layer 103 is disposed to be spaced apart from the power leads 21 and 22 by a predetermined distance by the insulating layer 102.

In the exemplary embodiment illustrated in FIG. 9, a first metal layer 201 of a substrate 200 is bonded to the lower sides of the power leads 21 and 22 and, as such, a second metal layer 203 of the substrate 200 may function as the conductive plate 30.

Figure 8:
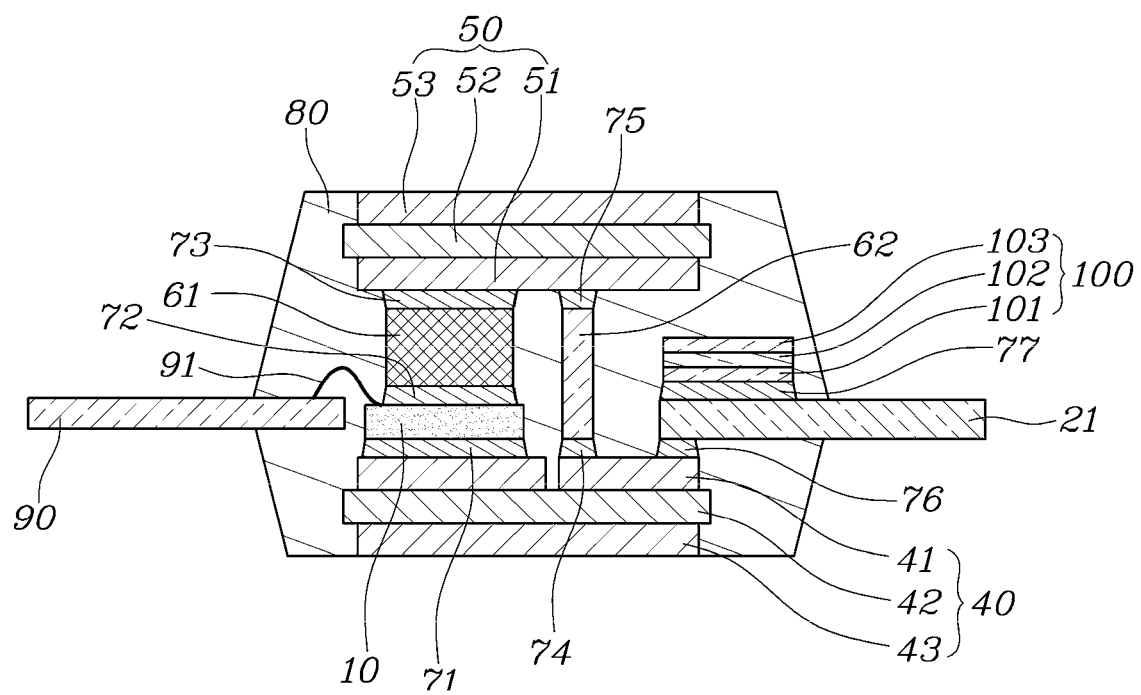

In the exemplary embodiments illustrated in FIGS. 8 and 9, each of the metal layers 103 and 201 bonded to the power leads 21 and 22 forms a pattern such that regions of each of the metal layers 103 and 201 respectively bonded to the first and second power leads 21 and 22 may be electrically insulated from each other. Reference numerals "76" and "77" in FIGS. 8 and 9 designate joints between each of the substrates 100 and 200 and respective power leads 21 and 22. Such joints may be formed through soldering, sintering or the like which is a known element bonding process.

In the exemplary embodiment illustrated in FIG. 10, the conductive plate 30 may have a structure bonded to the first metal layer 51 of the upper substrate 50. Reference numeral "78" designates a joint between the conductive plate 30 and the first metal layer 51. Such a joint may be formed through soldering, sintering or the like which is a known element bonding process.

A pattern may be formed at the first metal layer 51 in order to electrically insulate a region of the first metal layer 51, to which the conductive plate 30 is bonded, from other regions of the first metal layer 51.

Figure 11:
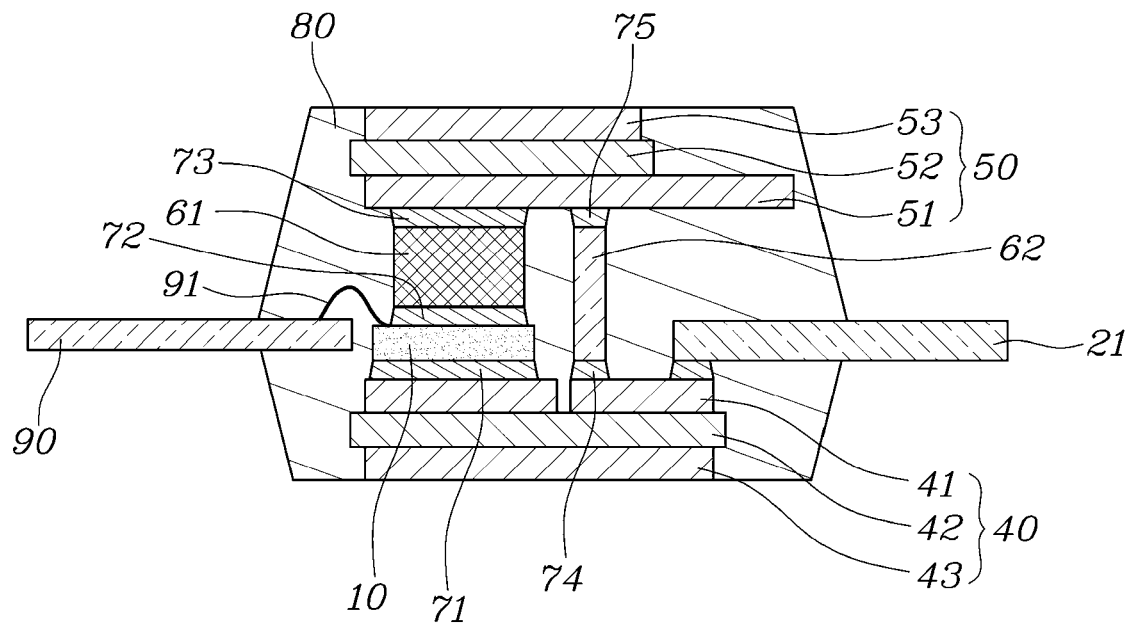

The exemplary embodiment illustrated in FIG. 11 is an embodiment in which the metal layer 51 of the upper substrate 50 extends to upper sides of the power leads 21 and 22 and, as such, may function as the conductive plate 30.

Figure 12:
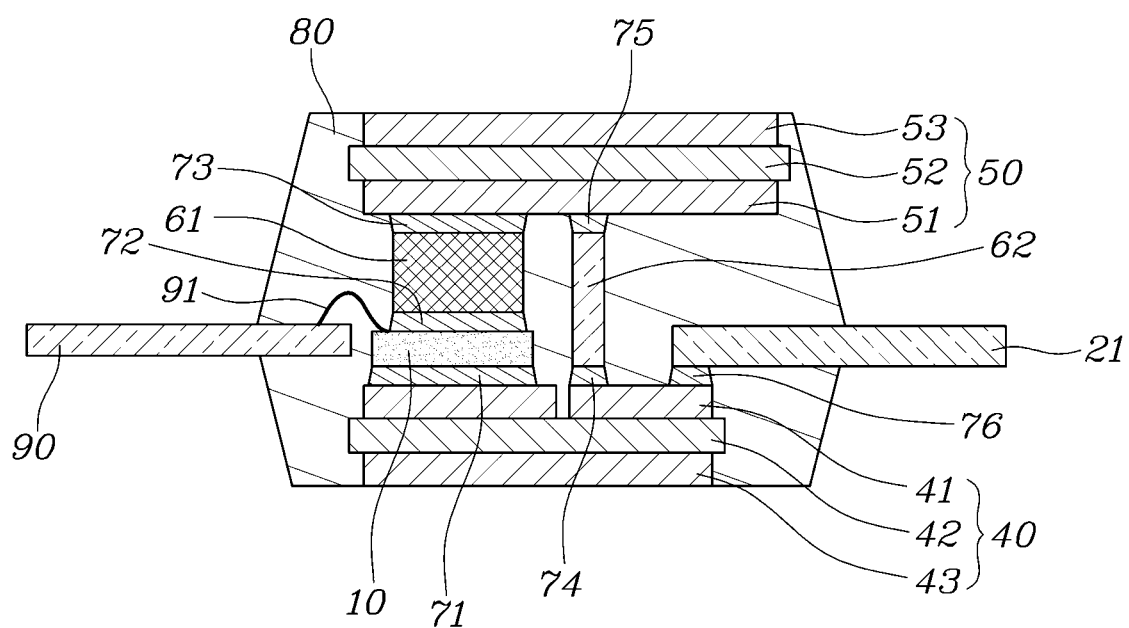

In addition, the exemplary embodiment illustrated in FIG. 12 is an embodiment in which all of the first metal layer 51, the insulating layer 52 and the second metal layer 52, which constitute the upper substrate 50, extend to upper sides of the power leads 21 and 22 and, as such, the first metal layer 51 may function as the conductive plate 30.

Figure 13:
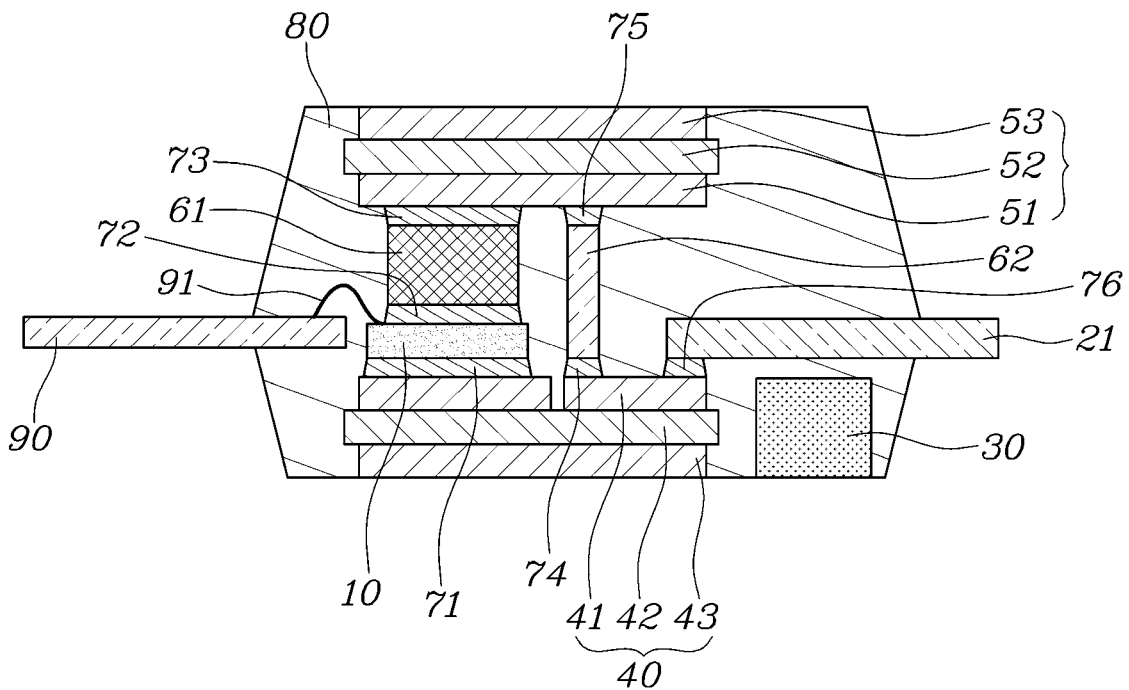

In the exemplary embodiment illustrated in FIG. 13, the conductive plate 30 is formed at lower sides of the power leads 21 and 22 such that the upper surface of the conductive plate 30 is spaced apart from the power leads 21 and 22 by a predetermined distance while facing the power leads 21 and 22, whereas the lower surface of the conductive plate 30 is exposed to the outside of the mold 80.

The exemplary embodiment of FIG. 13 is a structure obtained by forming the mold 80 under the condition that the conductive plate 30 is aligned with the lower substrate 40 in parallel to the lower substrate 40 in the same plane before formation of the mold 80 in the manufacturing process. There may be an advantage in terms of the process in that the conductive plate 30 may be easily disposed, so long as the height of the conductive plate 30 is appropriately determined.

Figure 14:
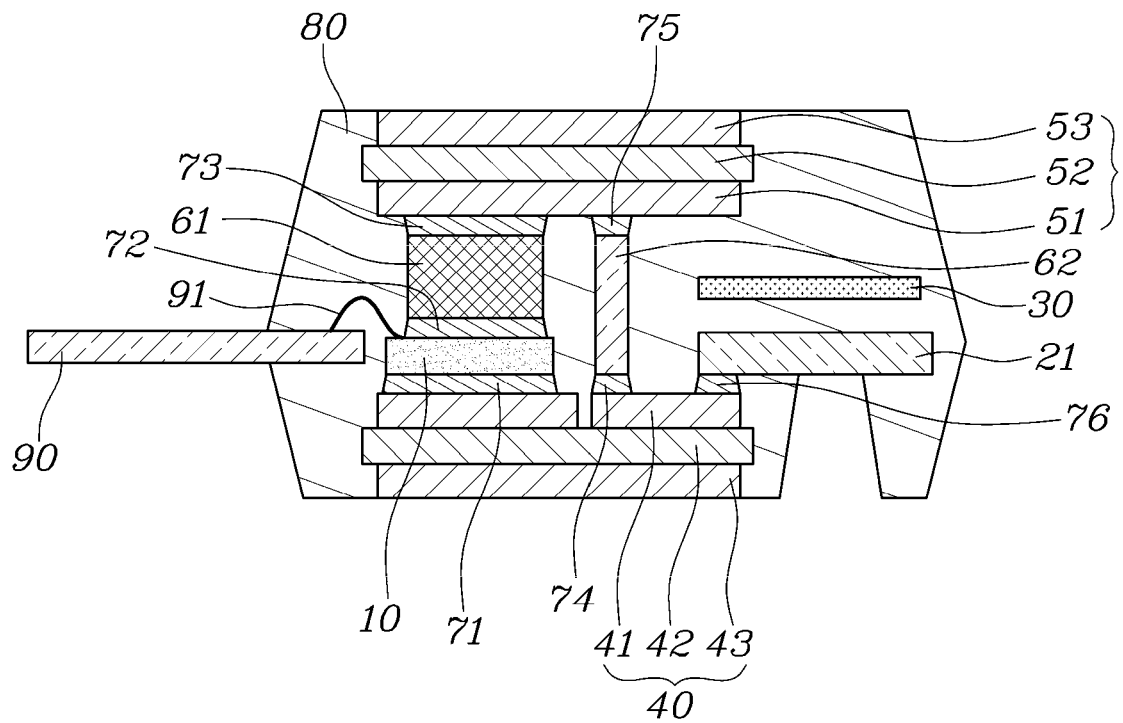

The exemplary embodiment of FIG. 14 is an embodiment in which the conductive plate 30 is installed at upper sides of the power leads 21 and 22, the mold 80 is formed to extend to ends of the power leads 21 and 22, and a lower portion of the mold 80 is partially removed such that the power leads 21 and 22 are exposed at removed portions of the mold 80, respectively.

In the exemplary embodiment of FIG. 14, the mold 80 does not expose the power leads 21 and 22 in a lateral direction, that is, a horizontal direction perpendicular to a vertical direction, and the power leads 21 and 22 may form, at lower sides thereof exposed from the mold 80, electrical connection with other power elements disposed outside the power module.

In such a structure, regions where the power leads 21 and 22 overlap with the conductive plate 30 within the mold 80, respectively, increase and, as such, image current flowing through the conductive plate 30 may increase. Accordingly, mutual inductance may be increased and, as such, inductance formed at a current loop may be further reduced.

As apparent from the above description, in the power module according to each of various exemplary embodiments of the present disclosure, a conductive plate, which functions as an image plate, is installed adjacent to a power lead, through which current entering and exiting a power semiconductor module flows, such that image current may flow through the conductive plate. Accordingly, it may be possible to reduce inductance of a loop, through which current flows, in accordance with mutual inductance increasing due to the image current.

As a result, it may be possible to reduce an overshoot voltage generated upon a switching operation due to parasitic inductance in the power module. Accordingly, system power loss and noise caused due to the overshoot voltage may be reduced, and damage to a power semiconductor device may also be prevented.

Although the preferred embodiments of the present disclosure have been disclosed for illustrative purposes, those skilled in the art will appreciate that various modifications, additions and substitutions are possible, without departing from the scope and spirit of the disclosure as disclosed in the accompanying claims.

The invention claimed is:

1. A power module comprising:
   a power semiconductor device having a first power terminal and a second power terminal;
   a first power lead electrically connected to the first power terminal of the power semiconductor device;
   a second power lead disposed in parallel to the first power lead and near the first power lead, the second power lead being electrically connected to the second power terminal of the power semiconductor device; and
   a conductive plate spaced apart from the first power lead or the second power lead by a predetermined distance, such that a region overlapping with the first power lead or the second power lead is formed.

2. The power module according to claim 1, wherein the conductive plate is disposed such that regions respectively overlapping with the first power lead and the second power lead are formed.

3. The power module according to claim 1, wherein the conductive plate is disposed at an upper or a lower side of the first power lead or the second power lead such that the overlapping region is formed in a vertical direction.

4. The power module according to claim 1, further comprising:
   a first metal layer bonded, at one surface thereof, to an upper or lower side of the first power lead or the second power lead; and
   an insulating layer bonded, at one surface thereof, to an other surface of the first metal layer;
   wherein the conductive plate is bonded to the other surface of the insulating layer.

5. The power module according to claim 4, wherein the first metal layer is formed with a pattern such that a region bonded to the first power lead and a region bonded to the second power lead are electrically insulated from each other.

6. The power module according to claim 1, further comprising:

a lower substrate disposed at a lower side of the power semiconductor device and formed with an electrical connection to the first power terminal of the power semiconductor device; and an upper substrate disposed at an upper side of the power semiconductor device and formed with an electrical connection to the second power terminal of the power semiconductor device;

wherein the conductive plate is bonded to a lower surface of the upper substrate.

7. The power module according to claim 6, wherein:

the upper substrate comprises a first metal layer having a region electrically connected to the second power terminal and a region to which the conductive plate is bonded; and the first metal layer is formed with a pattern such that the region electrically connected to the second power terminal and the region to which the conductive plate is bonded, are electrically insulated from each other.

8. The power module according to claim 1, further comprising:

a first metal layer disposed at an upper side of the power semiconductor device and electrically connected to one of the power terminals of the power semiconductor device;

an insulating layer bonded, at a lower surface thereof, to an upper surface of the first metal layer; and a second metal layer bonded to an upper surface of the insulating layer;

wherein the conductive plate is electrically connected to upper and lower sides of the first and second power leads.

9. The power module according to claim 1, further comprising:

a mold configured to mold the power semiconductor device, a portion of the first power lead, a portion of the second power lead, and the conductive plate;

wherein the conductive plate is disposed at a lower side of the first power lead or the second power lead such that an upper surface of the conductive plate is spaced apart from the first power lead or the second power lead by a predetermined distance while facing the first power lead or the second power lead, and a lower surface of the conductive plate is exposed to an outside of the mold.

10. The power module according to claim 1, further comprising:

a mold configured to mold the power semiconductor device, the first power lead and the second power lead while partially exposing lower surfaces of the first power lead and the second power lead;

wherein the conductive plate is disposed at an upper side of the first power lead or the second power lead.

11. The power module according to claim 10, wherein the mold prevents the first power lead and the second power lead from being exposed in a horizontal direction.

\* \* \* \* \*